United States Patent [19]

Bingham

[11] Patent Number: 5,694,075

[45] Date of Patent: Dec. 2, 1997

[54] SUBSTRATE CLAMP FOR NON-ISOLATED INTEGRATED CIRCUITS

[75] Inventor: David Bingham, Mt. Hamilton, Calif.

[73] Assignee: Maxim Integrated Products, Sunnyvale, Calif.

[21] Appl. No.: 367,007

[22] Filed: Dec. 30, 1994

[51] Int. Cl.[6] .................................................. H02J 1/00
[52] U.S. Cl. ........................ 327/534; 327/78; 327/81; 327/407; 327/410; 327/411; 327/545
[58] Field of Search .......................... 327/77, 78, 81, 327/407, 468, 409, 410, 411, 534, 535, 536, 537, 545, 546

[56] References Cited

U.S. PATENT DOCUMENTS

| | | | |
|---|---|---|---|
| 4,473,758 | 9/1984 | Huntington | 327/537 |
| 4,617,473 | 10/1986 | Bingham | 327/546 |
| 4,686,388 | 8/1987 | Hafner | 327/537 |
| 4,965,466 | 10/1990 | Pigott | 327/535 |
| 5,157,280 | 10/1992 | Schreck et al. | 327/537 |
| 5,382,837 | 1/1995 | Aiello et al. | 327/80 |
| 5,442,307 | 8/1995 | Shigehara et al. | 327/537 |

Primary Examiner—Terry Cunningham
Attorney, Agent, or Firm—Blakely, Sokoloff, Taylor & Zafman LLP

[57] ABSTRACT

A substrate clamp for non-isolated integrated circuits is disclosed. The substrate clamp comprises a circuit that controls the voltage on a substrate so that the substrate is connected to a specific node if the parasitic PN diodes at all the circuit nodes are not forward biased. If a specific node is then forced with an applied voltage to forward bias, the substrate is disconnected from its original node and maintains itself at a forward biased diode voltage drop away from the powered node. Various embodiments are disclosed. In one embodiment of the invention, a set of bipolar transistors which utilize the substrate as a common base, is implemented. The emitters of these transistors are connected to a set of nodes which may be driven to voltages outside the range between that provided by the power supply and ground, or any other pair of applied voltages. The collectors of these bipolar transistors are connected together. When any or all of the bipolar transistors are turned on, the substrate is disconnected from the power supply terminal and is forced to a VBE or diode drop away from the emitter of the turned-on transistor. When the node returns to a voltage within the range of the power supply, the substrate is reconnected to the original power supply node.

15 Claims, 5 Drawing Sheets

SUBSTRATE CLAMP FOR NON-ISOLATED INTEGRATED CIRCUITS

BACKGROUND OF THE INVENTION

1. Field of the Invention

The present invention relates generally to the field of monolithic integrated circuits and more particularly, to an apparatus and method of clamping the voltage of a local or global substrate in non-isolated integrated circuits.

2. Related Art

Each component on monolithic integrated circuits is generally isolated from the substrate through an inherent PN diode. If the applied voltage between the component and the substrate is such that it reverse biases this PN diode, the component is considered to be isolated. On the other hand, if the applied voltage is such that it substantially forward biases this PN diode, isolation does not occur. Without such isolation, one or more of the inherent PN junctions associated with devices that make up a variety of circuits including operational amplifier output stages and line drivers which would become forward biased. At a minimum, this would cause excessive current to flow into the substrate and in an extreme case, it would cause functional failure.

Substrate steering circuits are widely used on commercial monolithic integrated circuits to circumvent this problem. Conventional steering circuits, however, all use comparators that compare the various voltages on circuit nodes and then connect the substrate to the most appropriate node. The selected node is generally one with a voltage which does not allow forward biasing of the substrate with any of the components on the circuit.

These conventional substrate steering or snatching circuits are often complex, difficult to implement and provide poor transient responses. Use of these conventional substrate circuits are thus generally avoided with the use of more complex semiconductor processes to provide isolated pockets each containing portions of the circuitry. However, these circuits are complicated and involve increased chip area and cost.

Accordingly, there is a need in the technology for a substrate snatching circuit that is simple and which may be implemented without complex semiconductor processing or requiring a significant increase in chip area.

BRIEF SUMMARY OF THE INVENTION

A substrate clamp for non-isolated integrated circuits is disclosed. The substrate clamp comprises a circuit that controls the voltage on a substrate so that the substrate is connected to a specific node if the parasitic PN diodes at all the circuit nodes are not forward biased. If a specific node is then forced with an applied voltage to forward bias, the substrate is disconnected from its original node and maintains itself at a forward biased diode voltage drop away from the powered node. Various embodiments are disclosed.

In one embodiment of the invention, a set of bipolar transistors which utilize the substrate as a common base, is implemented. The emitters of these transistors are connected to a set of nodes which may be driven to voltages outside the range between that provided by the power supply and ground, or any other pair of applied voltages. The collectors of these bipolar transistors are connected together. When any or all of the bipolar transistors are turned on, the substrate is disconnected from the power supply terminal and is forced to a $V_{BE}$ or diode drop away from the emitter of the turned-on transistor. When the node returns to a voltage within the range of the power supply, the substrate is reconnected to the original power supply node.

DETAILED DESCRIPTION OF THE INVENTION

The present invention provides an apparatus and method for clamping the voltage of a local or global substrate, so that, irrespective of the voltages applied to the various components on the substrate, PN junctions formed between regions of devices and the substrate will not become substantially forward biased by the parasitic diodes associated with these components and the substrate.

More particularly, the present invention discloses an apparatus and method for controlling the voltage on a substrate so that the substrate is connected to a specific node, usually a power supply or ground terminal, if the parasitic PN diodes of all the circuit nodes are not forward biased. If a specified node(s) is (are) then forced with an applied voltage(s) to forward bias, the substrate is disconnected from its original specified node and maintains itself at a forward biased diode voltage drop away from the powered node(s). As a result, the substrate will not become substantially forward biased by the parasitic diodes and will be clamped at a specific voltage(s).

Figure 1:
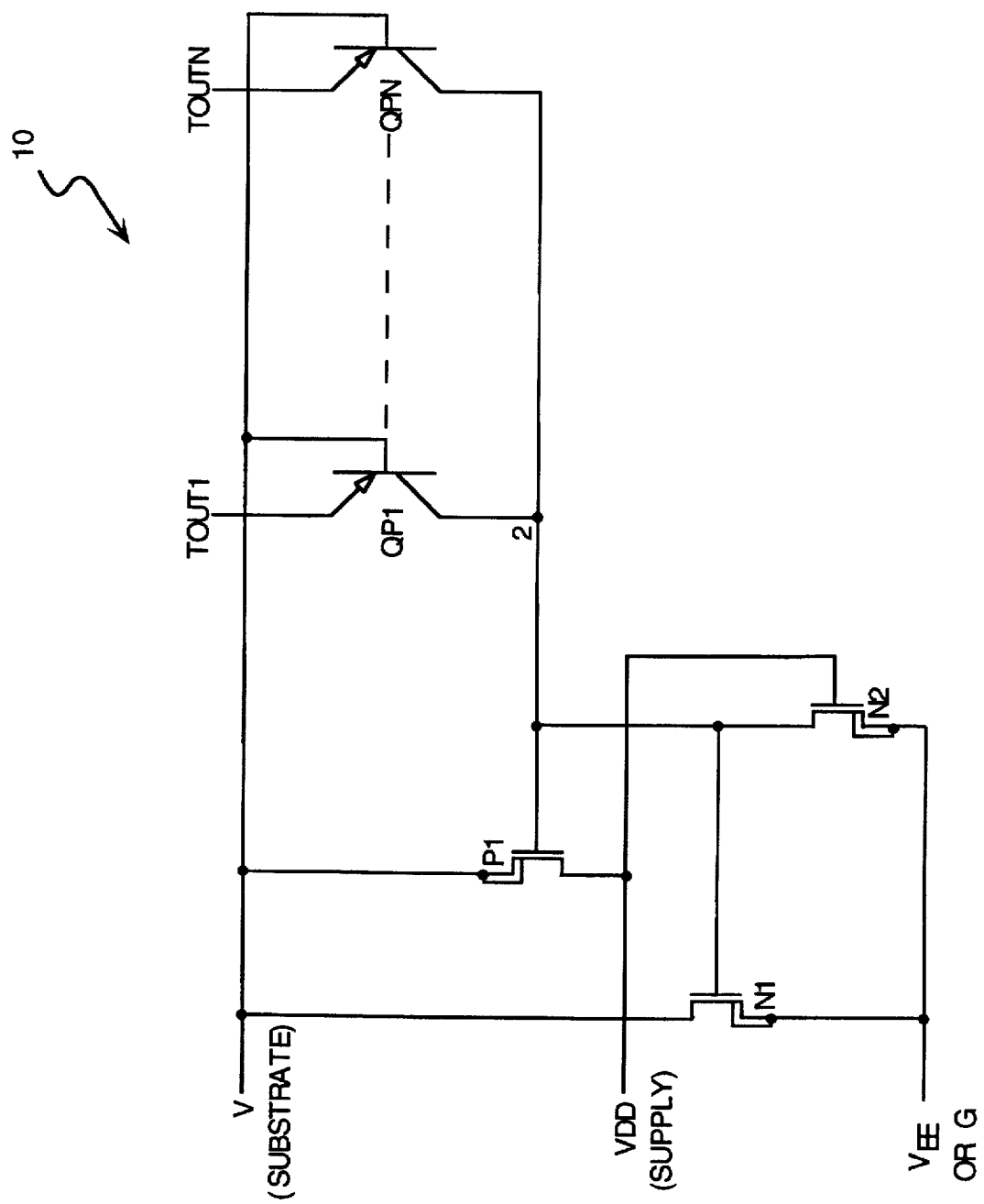
FIG. 1 is a schematic diagram of a substrate snatcher circuit in accordance with one embodiment of the present invention.

FIG. 1 depicts one embodiment of a substrate snatching circuit 10 of the present invention utilizing a set of bipolar transistors QP1–QPN with a common terminal, the substrate V, as their common base. The emitters of these transistors are connected to a set of nodes $T_{OUT1}$–$T_{OUTN}$ which may be driven to voltages beyond the range between that provided by the power supply $V_{DD}$ and ground G or any other pair of applied voltages such as $V_{DD}$ and $V_{EE}$, where $V_{EE}$ is less than $V_{DD}$. The collectors of these bipolar transistors QP1–QPN are connected together. If any or all of the bipolar transistors QP1–QPN are turned on, the substrate V is disconnected from the power supply $V_{DD}$ and is forced to a $V_{BE}$ or diode drop away from the most positive of the emitter(s) of the turned on transistor(s) QP1 to QPN. When the node(s) is returned to a voltage(s) within the range of the power supply, the substrate V is reconnected to the original power supply node $V_{DD}$. This is described in greater detail below.

As depicted in FIG. 1, the substrate clamp 10 employs multiple forcing nodes $T_{OUT1}$ through $T_{OUTN}$ that may be forced to a voltage or to voltages more positive than the supply voltage $V_{DD}$. However, any or all of the nodes from $T_{OUT1}$ through $T_{OUTN}$ can be used to produce the same results. In addition, an n-type substrate is used in the present embodiment for discussion purposes. Accordingly, the bipolar transistors QP1–QPN in the present embodiment are PNP transistors. However, P-type substrate material may also be used, and where utilized, all transistors QP1–QPN in the substrate clamp 10 will be NPN-type transistors.

The substrate clamp 10 comprises three transistors, P1, N1, N2 and transistor(s) QP1 through QPN. P1 is a P-channel transistor, N1 and N2 are N-channel transistors and QP1 through QPN are PNP transistors. As discussed earlier, the circuit 10 may also be implemented by using complementary transistors, specifically, where P1 is an N-channel transistor, N1 and N2 are P-channel transistors and QP1 through QPN are NPN transistors.

In operation, if a positive voltage that is greater than the turn-on voltage of P1 is applied to $V_{DD}$, and the applied voltages on nodes $T_{OUT1}$ through $T_{OUTN}$ are greater than the applied voltage on $V_{DD}$ by a value that is less than the turn-on voltage of any one of QP1–QPN, N2 will turn on, and node 2 will be held close to ground. This results in turning P1 on, and turning N1 off, effectively connecting the substrate V to $V_{DD}$.

Next, if any or all of the nodes $T_{OUT1}$ through $T_{OUTN}$ are forced more positive than $V_{DD}$ by the turn-on voltage of QP1 through QPN respectively, current will be sourced by QP1 through QPN. If the value of that current is greater than the current that N2 can supply, node 2 will rise positively to a value close to that of the forced voltage(s) and will turn off P1 and turn on N1. N1 supplies the necessary base current drive to transistors QP1 through QPN so that their collector current(s) can equal the current that N2 supplies. As a result, the substrate V, will be disconnected from $V_{DD}$ and will assume a potential essentially one PNP turn-on voltage less than the forced voltage(s) on the $T_{OUT}$ line(s). In other words, V will be clamped one $V_{BE}$ below the $T_{OUT}$ line and held at that level by current through N1. As a result, the substrate will not be substantially forward biased.

Figure 2:
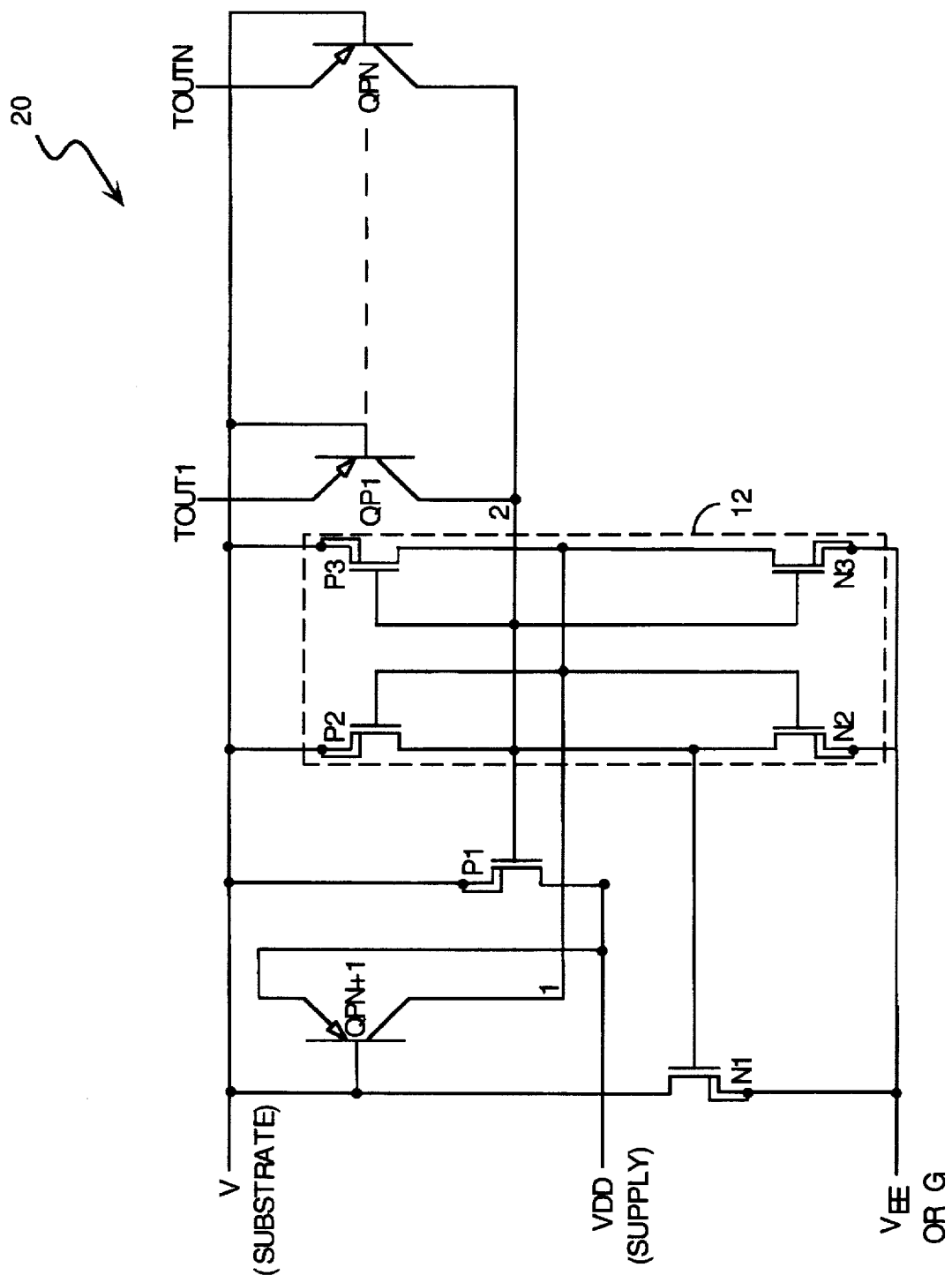
FIG. 2 is a schematic diagram of a substrate snatcher circuit in accordance with a second embodiment of the present invention.

FIG. 2 depicts a schematic diagram of a second embodiment of the substrate snatching circuit 20 of the present invention. In the substrate snatching circuit 20, a Set, Reset (SR) flip flop 12 and a PNP transistor QPN+1 is added to the circuit 10 of the previous embodiment.

The SR flip-flop 12 consists of 2 cross-coupled inverters—P2, N2 and P3, N3. This SR flip-flop 12 controls the two transistors N1 and P1. If the voltage on $T_{OUT1}$ is less than or approximately equal to the voltage $V_{DD}$, transistor N1 will be off and transistor P1 will be turned on, connecting the line V and $V_{DD}$. The flip-flop 12 sets node 1 high and node 2 low. In this state, the circuit consumes no significant power. If a voltage more positive than about 0.7 volt greater than the supply $V_{DD}$ is applied to node $T_{OUT1}$, the base emitter diode of transistor QP1 is forward biased. The resultant collector current tends to pull node 2 high against the available drain current of N2. If the collector current of QP1 is large enough to exceed the drain current of N2, the flip-flop 12 changes state. Node 2 is set high and node 1 is set low. This turns off P1 and turns on N1. In doing so, N1 draws a small current to ground G from node V through the emitter-base of QP1. This current pulls the substrate down with respect to either node $T_{OUT1}$ or $V_{DD}$ to one $V_{BE}$ below $T_{OUT1}$. If the drive to $T_{OUT1}$ is removed, the voltage on the substrate node V will be pulled down by transistor N1 until the PNP transistor QPN+1 is turned on. If the collector current of QPN+1 exceeds the drain current of N3, the flip-flop 12 will change state with node 1 acquiring a high state and node 2 a low state. Thus N1 will be turned off and P1 turned on, returning the current to its initial state and resulting in the substrate V being connected to $V_{DD}$.

Figure 3:
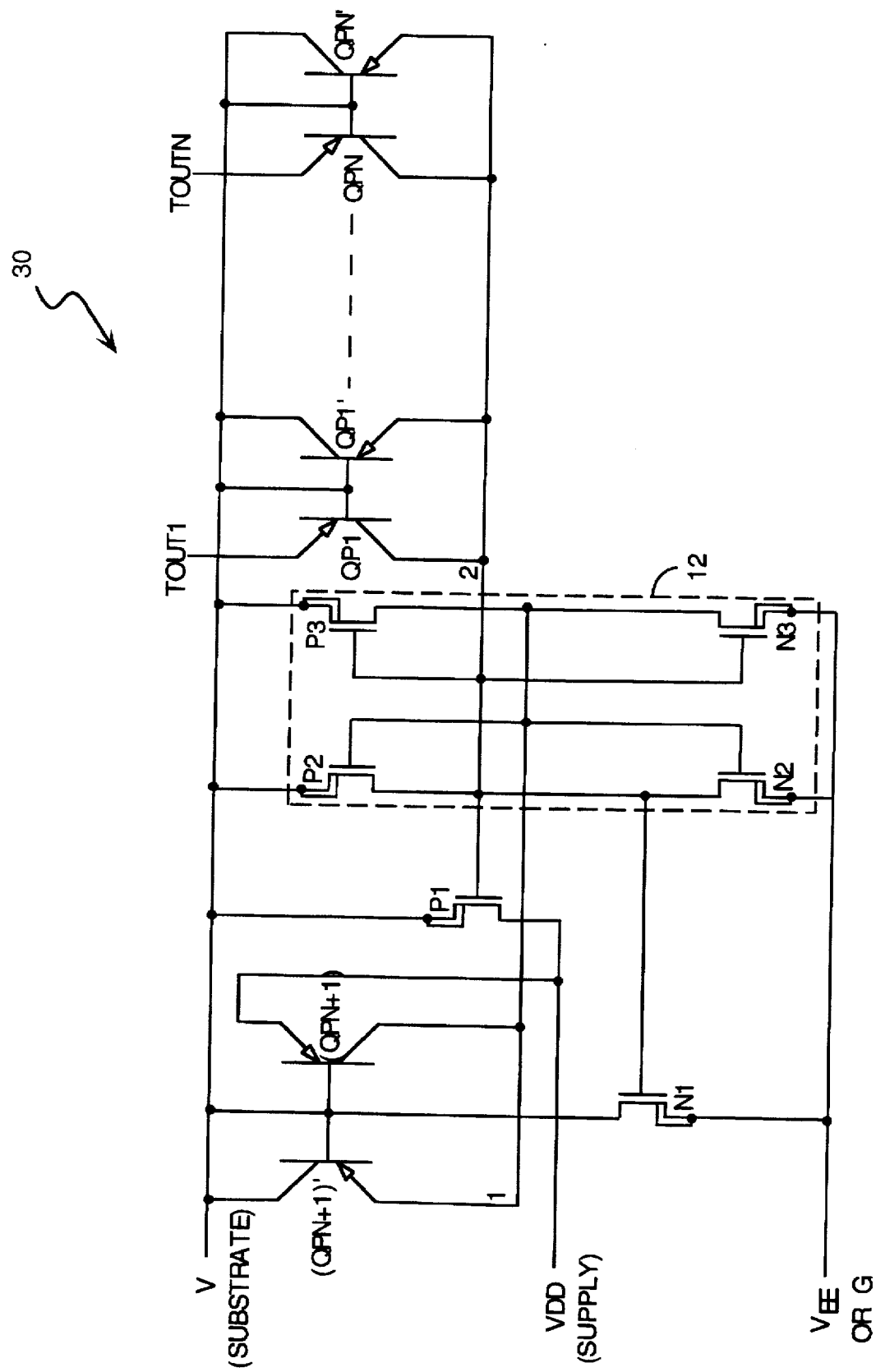
FIG. 3 is a schematic diagram of a substrate snatcher circuit in accordance with a third embodiment of the present invention.

FIG. 3 illustrates a schematic diagram of a substrate snatcher circuit 30 in accordance with a further embodiment of the present invention. The circuit 30 is a practical implementation of the circuit 20 in which serial collectors are added by means of additional PNP transistors QP1', QP2', . . . QPN', (QPN+1)'. Due to the proximity of components in an integrated circuit and the ability of minority carriers to diffuse significant distances in the substrate when PN junctions are forward biased, a significant number of minority carriers may not be channeled through the collectors of QP1–QPN. The additional serial collectors serve to collect most of the minority carriers that are not channeled through the collectors of QP1–QPN.

Transistors QP1', QP2', . . . QPN', (QPN+1)' are anti-saturation devices that collect minority carriers injected into the substrate, well or pocket, if either QPN+1, or any of QP1 through QPN are forced into saturation whereby their collectors act as emitters. The injection of minority carriers into the substrate should be constrained to the region close to the PNP transistor QPN+1 and the transistors QP1–QPN connected to the forcing nodes $T_{OUT1}$ through $T_{OUTN}$. Otherwise, adjacent nodes may collect these minority carriers and have their electrical characteristics corrupted. It should be noted that the collectors of these secondary transistors could alternatively be connected to ground (G) instead of to the substrate (V) as shown in the circuit 40 of FIG. 4. This alternative embodiment will be discussed in greater detail in the following sections.

Figure 4:
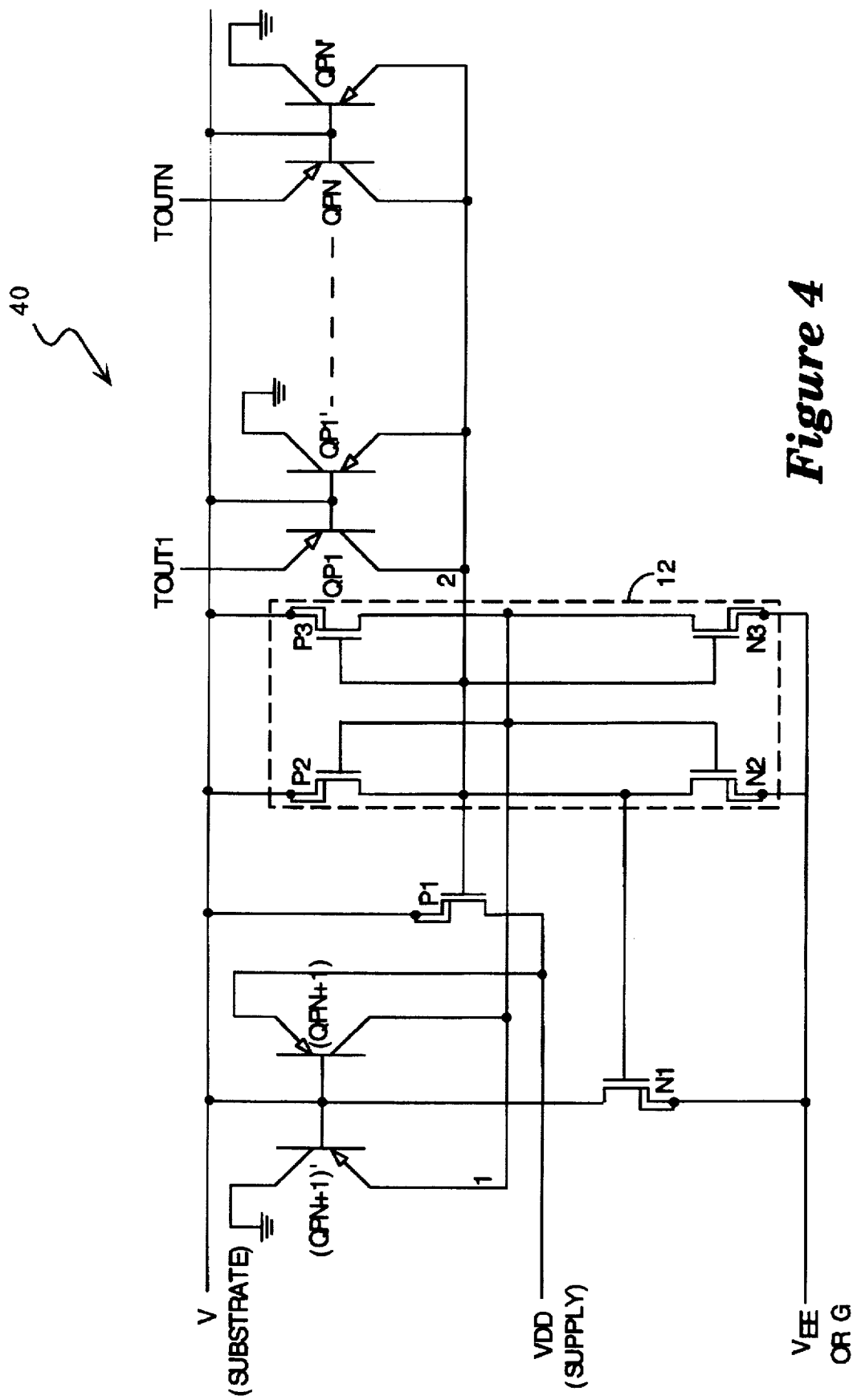
FIG. 4 is a schematic diagram of a substrate snatcher circuit in accordance with a fourth embodiment of the present invention.
Figure 5A:
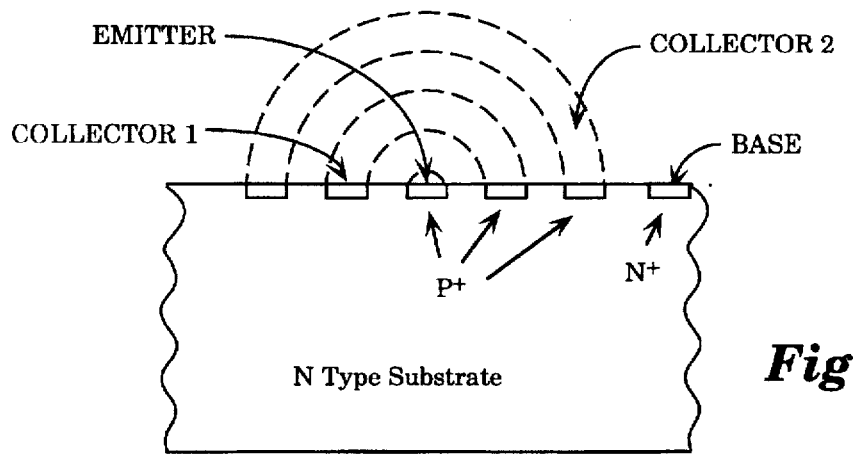
FIG. 5A is an elevational cross sectional view of one embodiment of a double PNP transistor which may be implemented in the substrate snatcher circuit of FIGS. 3 and 4.
Figure 5B:
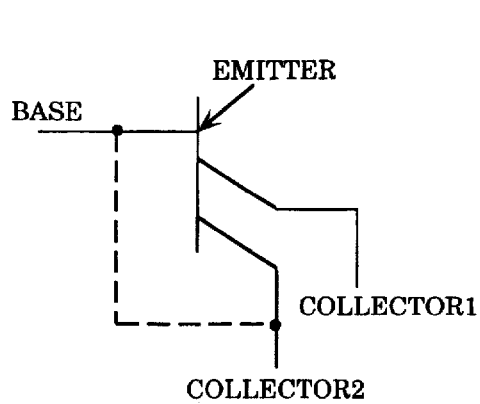
FIG. 5B is a schematic representation of the double PNP transistor of FIG. 5A.

In practice, both Q1 and Q3 are integrated into Q2 and Q3 as additional collectors, as shown in FIG. 5A and FIG. 5B. Specifically, FIG. 5A illustrates an elevational cross sectional view of one embodiment of a double PNP transistor which may be implemented in the substrate snatcher circuit of FIGS. 3 and 4. FIG. 5B illustrates a schematic representation of the double PNP transistor of FIG. 5A. When biased to operate in the active mode, the emitter-base voltage $V_{EB}$ causes the P-type emitter to be higher in potential than the N-type base, thus forward-biasing the base-emitter junction. The collector-base junction is reverse-biased by the base-collector voltage $V_{BC}$, which keeps the N-type base higher in potential than the P-type collector. Current in the PNP device is mainly conducted by holes injected from the emitter into the base by the forward-bias voltage $V_{EB}$. Since the component of emitter current contributed by electrons injected from base to emitter is kept small by using a lightly doped base, most of the emitter current will be due to holes. The electrons injected from base to emitter give rise to the dominant component of base current. In addition, a number of holes injected into the base will recombine with the majority carriers in the base (electrons) and will thus be lost. The disappearing base electrons will have to be replaced from the external circuit, giving rise to a second component of base current. The holes that succeed in reaching the boundary of the depletion region of the collector-base junction will be attracted by the negative voltage on the collector. Thus these holes will be swept across the depletion region into the collector and appear as collector current. The addition of a second collector, COLLECTOR 2 ensures that minority carriers injected into the substrate, well or pocket, are attracted to COLLECTOR 2 if either QPN+1, or any of QP1 through QPN are forced into saturation whereby their COLLECTORS 1 act as emitters. Thus, adjacent nodes will be prevented from collecting a number of these minority carriers and their electrical characteristics will not be corrupted. If the double collector transistors were implemented in the circuit 40 of FIG. 4, COLLECTOR 2 will be grounded, and minority carriers will be attracted by COLLECTOR 2 and appear as collector current from COLLECTOR 2, which will subsequently be grounded.

Figure 5C:
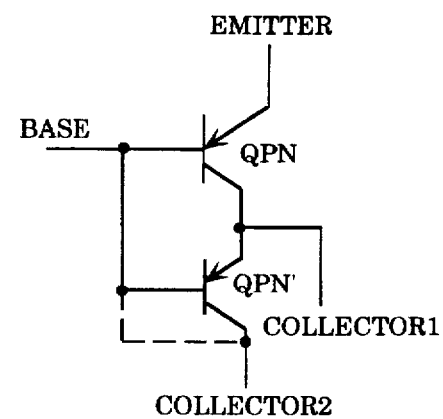
FIG. 5C is a schematic representation of the double PNP transistor of FIG. 5B implemented through the use of two transistors.

FIG. 5C depicts a schematic representation of the double PNP transistor of FIG. 3 and FIG. 4 implemented through the use of two transistors. Separate transistors are shown in FIGS. 3 and 4 rather than double collector transistors. As shown in FIG. 5C, transistor QPN' is an anti-saturation device which collects minority carriers injected into the substrate, well or pocket, if QPN is forced into saturation such that its collector COLLECTOR 1 acts as an emitter. With COLLECTOR 1 acting like an emitter, COLLECTOR 2 is implemented to attract minority carriers so that these minority carriers appear as collector current from COLLECTOR 2, as discussed above.

The present invention offer several advantages. First, unlike conventional circuits, no comparators are utilized, resulting in a simpler circuit arrangement. Secondly, the substrate does not have to be connected directly to any node, resulting in the reduction of errors. Thirdly, the substrate will be forward biased with respect to a forced node, providing an accessible point of control. A particularly important use of the invention is where line drivers are overdriven to voltages greater than the supply voltages used to power the line drivers. Without the present invention, one or more of the inherent PN junctions associated with the devices that make up the line drivers would become forward biased and at the minimum cause excessive current to flow into the substrate and in the extreme case cause functional failure.

Although the preferred embodiment of the present invention has been described and illustrated above, those skilled in the art will appreciate that various changes and modifications can be made to the present invention without departing from its spirit. Accordingly, the scope of the present invention is defined by the scope of the following appended claims.

What is claimed is:

1. A circuit for controlling the voltage applied to a substrate, comprising:

a first terminal for coupling to a first power supply voltage, a second terminal for coupling to a second power supply voltage, and a third terminal for coupling to a first forcing node voltage;

a first transistor of a first conductivity type, having an emitter, a base and a collector;

a second transistor of a second conductivity type having a drain, a source and a gate;

third and fourth transistors of a third conductivity type, each having a drain, a source and a gate;

the collector of the first transistor, the gate of the second transistor, the gate of the third transistor and the drain of the fourth transistor being coupled together;

the base of the first transistor, the source of the second transistor and the drain of the third transistor being coupled to the substrate;

the drain of the second transistor and the gate of the fourth transistor being coupled to the first terminal;

the emitter of the first transistor being coupled to the third terminal; and the sources of the third and fourth transistors being coupled to the second terminal;

wherein in a first state, the substrate is coupled to the first terminal if the first forcing node voltage is of insufficient level to turn on the first transistor and in a second state, the substrate is coupled to the third terminal if the first forcing node voltage is of sufficient level to turn on the first transistor.

2. The circuit of claim 1, further comprising a fifth transistor of the first conductivity type, having an emitter, a base and a collector, the collector of the fifth transistor being coupled to the gate of the second transistor, the base of the fifth transistor being coupled to the substrate and the emitter of the fifth transistor being coupled to a fourth terminal for coupling to a second forcing node voltage.

3. The circuit of claim 1, wherein in the second state the first forcing node voltage is greater than the first power supply voltage.

4. The circuit of claim 1, further comprising a latching circuit for stabilizing the first and second states, the latching circuit being responsive to the voltage on the third terminal relative to the voltage on the first terminal to determine the state of the latching circuit.

5. The circuit of claim 4, wherein the latching circuit comprises:

fifth and sixth transistors of the second conductivity type, each having a drain, a source and a gate;

a seventh transistor of the third conductivity type, having a drain, a source and a gate;

the sources of the fifth and sixth transistors being coupled to the substrate;

the gate of the fifth transistor, the drain of the sixth transistor and the drain of the seventh transistor being coupled together; and the drain of the fifth transistor, the gate of the sixth transistor and the gate of the fourth transistor being coupled together.

6. The circuit of claim 1, wherein the first conductivity type is a PNP transistor, the second conductivity type is a P-channel transistor and the third conductivity type is an N-channel transistor.

7. The circuit of claim 5, wherein the first conductivity type is a PNP transistor, the second conductivity type is a P-channel transistor and the third conductivity type is an N-channel transistor.

8. The circuit of claim 1, further comprising a fifth transistor of the first conductivity type, having an emitter, a base and a collector, the base of the fifth transistor being coupled to the base of the first transistor, the collector of the fifth transistor being coupled to the substrate and the emitter of the fifth transistor being coupled to the collector of the first transistor.

9. The circuit of claim 8, wherein the first conductivity type is a PNP transistor, the second conductivity type is a P-channel transistor and the third conductivity type is an N-channel transistor.

10. A method of controlling the voltage applied to a substrate, the method comprising the steps of:

providing a first terminal for coupling to a first voltage and a second terminal for coupling to a first forcing node voltage;

providing a first transistor having an emitter, a base and a collector;

providing a second transistor having a drain, a source and a gate;

connecting the emitter of the first transistor to the second terminal, the base to the substrate, and the collector to the gate of the second transistor;

connecting the source and drain of the second transistor between the substrate and the first terminal respectively;

turning on the second transistor if the first forcing node voltage is of insufficient voltage relative to the first voltage to turn on the first transistor; and turning off the second transistor if the first forcing node voltage is of sufficient voltage relative to the first voltage to turn on the first transistor.

11. The method of claim 10, further comprising the steps of:

providing a third transistor having an emitter, a base and a collector, the collector of the third transistor being coupled to the gate of the second transistor, the base of the third transistor being coupled to the substrate, and the emitter of the third transistor being coupled to a third terminal for coupling to a second forcing node voltage;

turning on the second transistor if both the first and second forcing node voltages are of insufficient voltage relative to the first voltage to turn on the first and third transistors respectively; and turning off the second transistor if either of the first and second forcing node voltages is of sufficient voltage relative to the first voltage to turn on the first and third transistors respectively.

12. The method of claim 10, wherein the step of turning on the first transistor includes the step of providing a first current source connected between the gate of the second transistor and a fourth terminal for causing the gate of the second transistor to be coupled to the second terminal in response to the first forcing node voltage.

13. The method of claim 12, wherein the step of turning off the second transistor includes the step of providing a second current source connected between the substrate and the fourth terminal for providing the base current drive to the first transistor in response to the first forcing node voltage.

14. The method of claim 10, wherein the step of providing a first transistor includes the step of providing a PNP transistor.

15. The method of claim 10, wherein the step of providing a second transistor includes the step of providing a P-channel transistor.

* * * * *